United States Patent
Scheffler

(10) Patent No.: US 6,803,830 B2
(45) Date of Patent: Oct. 12, 2004

(54) PHASE-LOCKED LOOP AND METHOD FOR AUTOMATICALLY SETTING ITS OUTPUT FREQUENCY

(75) Inventor: Bernd Scheffler, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 10/177,196

(22) Filed: Jun. 21, 2002

(65) Prior Publication Data

US 2003/0016088 A1 Jan. 23, 2003

(30) Foreign Application Priority Data

Jul. 17, 2001 (DE) .......................................... 101 34 640

(51) Int. Cl.[7] .............................................. H03L 7/00
(52) U.S. Cl. ................................ 331/36 C; 331/117 R; 331/177 R; 331/177 V
(58) Field of Search ......................... 331/36 C, 117 R, 331/177 R, 177 V, 179, 16

(56) References Cited

U.S. PATENT DOCUMENTS

| | | | |
|---|---|---|---|
| 3,538,450 A | 11/1970 | Andrea et al. | ................. 331/10 |
| 5,648,744 A | 7/1997 | Prakash et al. | ................. 331/11 |
| 6,133,797 A | * 10/2000 | Lovelace et al. | ............. 331/17 |
| 6,215,363 B1 | * 4/2001 | Conta et al. | ................... 331/17 |
| 2002/0135428 A1 | * 9/2002 | Gomez | ........................ 331/17 |

FOREIGN PATENT DOCUMENTS

| | | |
|---|---|---|
| DE | 33 13 868 A1 | 4/1983 |
| EP | 0 944 171 A1 | 9/1999 |

OTHER PUBLICATIONS

Dally et al., Digital Systems Engineering, 1998, The Press Syndicate of Univarsity of Cambrdge, pp. 615–619.*

* cited by examiner

Primary Examiner—Quan Tra
(74) Attorney, Agent, or Firm—Wade James Brady, III; Frederick J. Telecky, Jr.

(57) ABSTRACT

A phase-locked loop (10) comprises a voltage-controlled oscillator (12) to which a control voltage is applied as produced by a phase/frequency detector (22) as a function of the difference between the frequency ($f_{ref}$) of a reference signal and the output frequency ($f_{vco}$) of the voltage controlled oscillator (12) and the oscillator contains as a frequency-influencing circuit element a varactor (14) whose capacitance value can be varied over a fine adjustment range by the control voltage for altering the output frequency. A variable capacitance (18) is provided which can be connected in parallel to the varactor (14) when there is a change in the frequency ($f_{ref}$) of the reference signal, the value of this capacitance (18) being adjustable as a function of the control voltage output by the phase/frequency detector (22).

4 Claims, 1 Drawing Sheet

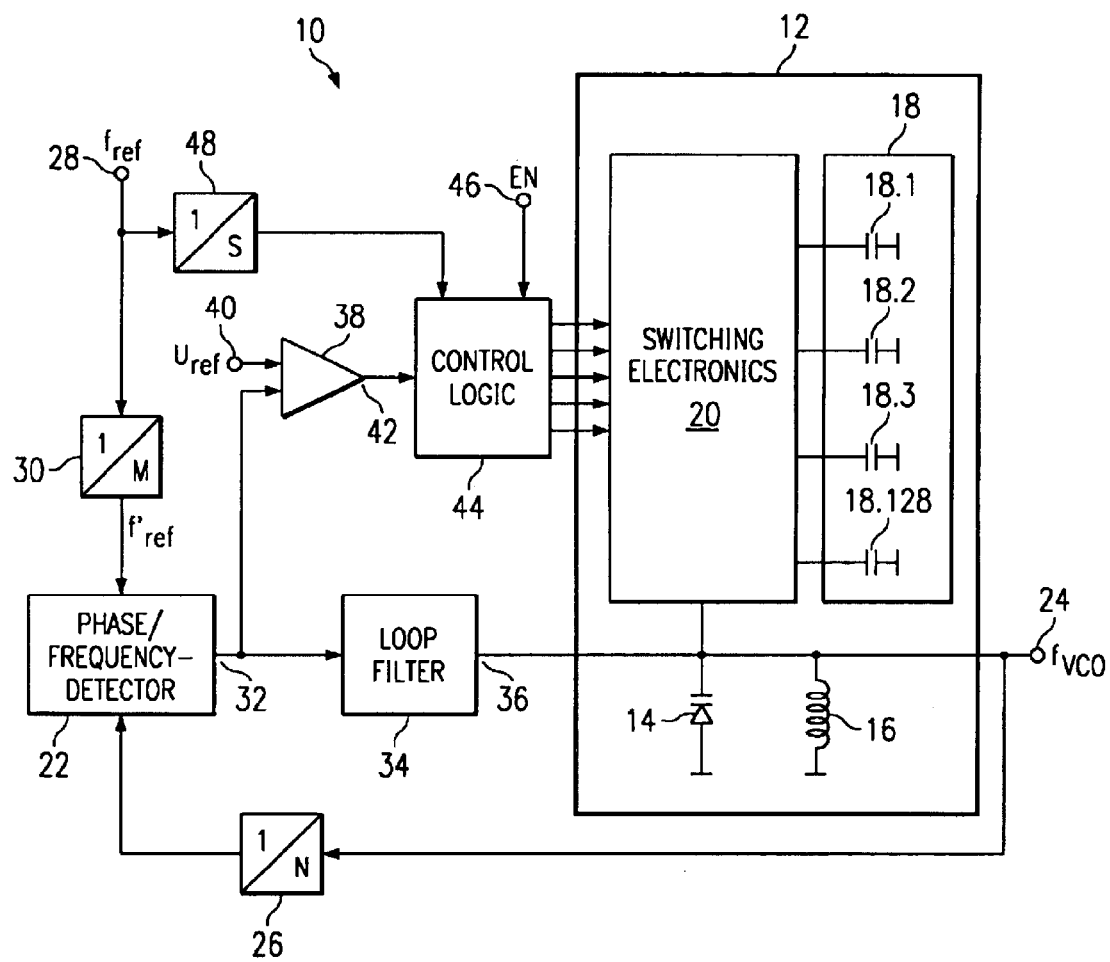

PHASE-LOCKED LOOP AND METHOD FOR AUTOMATICALLY SETTING ITS OUTPUT FREQUENCY

TECHNICAL FIELD OF THE INVENTION

The invention relates to a phase-locked loop comprising a voltage-controlled oscillator to which a control voltage is applied as produced by a phase/frequency detector as a function of the difference between the frequency of a reference signal and the output frequency of the voltage controlled oscillator, the oscillator containing as a frequency-influencing circuit element a varactor whose capacitance value can be varied over a fine adjustment range by the control voltage for altering the output frequency. The invention relates furthermore to a method for automatically setting the output frequency of one such phase-locked loop.

BACKGROUND OF THE INVENTION

In conventional phase-locked loops the components of the voltage-controlled oscillator dictating the frequency are selected so that the output frequency of this oscillator can be maintained at a desired setpoint value within a fine adjustment range to thus make it possible to compensate deviations in the tolerance of the capacitance value of the varactor employed as the component dictating the frequency by the phase/frequency detector outputting a control voltage which changes the capacitance value so that the capacitance value of the varactor needed to achieve the desired output frequency is set. This results in the output frequency of the voltage-controlled oscillator remaining constant as long as the circuit experiences no changes due to temperature, aging and/or production which necessitate a change in frequency exceeding the fine adjustment range. To produce large frequency changes in the output frequency of the oscillator the components dictating the frequency in the voltage-controlled oscillator need to be replaced so that the oscillator can operate at the desired new setpoint frequency.

SUMMARY OF THE INVENTION

The invention is based on the objective of configuring a phase-locked loop of the aforementioned kind so that the circuit automatically adjusts to the new desired output frequency even when large changes in the frequency are wanted.

This objective is achieved in accordance with the invention by providing a variable capacitance which can be connected in parallel to the varactor when there is a change in the frequency of the reference signal and by the value of this capacitance being adjustable as a function of the control voltage output by the phase/frequency detector.

This configuration of the phase-locked loop in accordance with the invention permits automatically adapting the frequency-dictating component in the voltage-controlled oscillator to the newly desired output frequency which now permits the phase-locked loop to be put to use in a wide frequency range and, more particularly, also permits it being achieved in an integrated circuit.

BRIEF DESCRIPTION OF THE DRAWING

For a more complete understanding of the present invention and for further advantages thereof, reference is now made to the following detailed description in conjunction with the drawing in which:

FIGURE is a block diagram of the phase-locked loop in accordance with the invention.

PREFERRED EMBODIMENT OF THE INVENTION

The invention will now be detailed, by way of example, with reference to the drawing, the sole FIGURE of which is a block diagram of the phase-locked loop in accordance with the invention.

The phase-locked loop 10 shown in the drawing contains a voltage-controlled oscillator 12 of which only the components needed for generating the desired output frequency are depicted diagrammatically, these being a varactor 14 as well as a coil 16 which forms together with the varactor 14 a resonant circuit whose resonant frequency corresponds to the desired output frequency of the voltage-controlled oscillator 12. The voltage-controlled oscillator 12 contains furthermore an array of capacitors 18, the individual capacitors 18.1, 18.2 ... 18.128 of which can be switched parallel to the varactor 14 by means of an electronic switching assembly 20. How the electronic switching assembly 20 functions will be detained below.

The phase-locked loop 10 contains furthermore a phase/frequency detector 22 which compares the frequency output at the output 24 of the voltage-controlled oscillator 12, after being divided by a divider circuit 26, to the frequency $f''_{ref}$ of a reference signal at an input 28 applied thereto via a divider circuit 30. As evident, this frequency is derived from the reference frequency $f_{ref}$ directly by the division. The phase/frequency detector outputs at its output 32 a signal which is proportional to the deviation of the two frequencies compared. This signal is supplied to a loop filter 34 which generates from the output signal of the phase/frequency detector 22 a control voltage at the output 36 which is supplied to the varactor 14 and which dictates its capacitance value. This phase-locked loop 10 is thus capable of controlling the frequency output by the voltage-controlled oscillator 12 to a desired output frequency $f_{vco}$ resulting from the following equation:

$$f_{vco} = f_{ref} \times \frac{N}{M}$$

where $f_{ref}$ is the reference frequency from which the frequency $f'_{ref}$ supplied to the input 28 is derived, whilst N and M are the division ratios of the divider circuits 26 and 30 respectively.

The phase-locked loop 10 as shown in the drawing contains a comparator 38 which compares the signal output by the phase/frequency detector 22 to a reference voltage $U_{ref}$ supplied to its input 40. Depending on whether the voltage value of the signal output by the phase/frequency detector 22 is larger or smaller than the reference voltage $U_{ref}$ the comparator 38 outputs a "1" or "0" signal at its output 42. This signal is applied to a control logic 44, the function of which will be detailed later. The control logic 44 ensures that as many capacitors of the capacitor array 18 are switched in parallel to the varactor 14 as is necessary to achieve the desired output frequency $f_{vco}$ via the electronic switching assembly 20 when there is a change in the frequency $f_{ref}$ supplied to the phase/frequency detector 22.

In describing how the phase-locked loop 10 works it is assumed that the closed loop is locked to a specific frequency as resulting from the aforementioned equation and that none of the capacitors of the capacitor array 18 is connected in parallel to the varactor 14, i.e. the electronic switching assembly 20 having separated all capacitors 18.1 to 18.128. Within a fine adjustment range the closed loop is able to compensate all changes by altering the control voltage applied to the varactor 14 which could possibly result in a change in frequency at the output of the voltage-controlled oscillator 12. Assuming now that the output frequency $f_{voc}$ of the voltage-controlled oscillator needs to be reduced to half its value, this is usually achieved by correspondingly changing the division ratios M and N in the divider circuits 26, 30; although it is also possible to reduce the reference frequency $f_{ref}$ to half its value without changing the division ratios.

This change in frequency results in the phase/frequency detector 22 outputting at its output 32 a greatly changed signal, the voltage value of which is smaller than the reference voltage $U_{ref}$ at the input 40 of the comparator 38, which thus output a "0" signal at its output 42. This change in frequency causes an enable signal EN to be applied to an enable input 46 of the control logic 44 which prompts in this control logic 44 a sequence, resulting in the capacitors of the capacitor array 18 being switched on or off. The control logic 44 is in turn controlled by a clock signal derived from the reference frequency $f_{ref}$ by division in the divider circuit 48. Assuming, for example, that the division factor S of the divider circuit 48 has the value 5, then this means that the control logic 44 outputs a signal to the electronic switching assembly 20 to trigger the switching actions after every fifth cycle of the reference frequency $f_{ref}$.

Assuming furthermore as an example that the capacitor array 18 contains a total of 128 capacitors 18.1 to 18.128 then, since the on/off switching of the individual capacitors by the electronic switching assembly 20 is done on the principle of successive approximation, this means that in a first step all 128 capacitors of the capacitor array 18 are switched on, after which, depending on the output signal of the comparator 38 64, 32, 16, 8, 4 and 2 individual capacitors are switched off or on in six further steps in sequence, whilst in a last step a single capacitance value is switched off or on. Thus, every time an enable occurs by application of the enable signal EN the control logic 44 implements eight sequential steps which prompt eight switching actions in the electronic switching assembly 20.

When, in the example as described, a signal having the value "0" occurs at the output 42 of the comparator 38 due to a change in the division ratios of the divider circuit 26, 30, then the control logic 44 outputs a first signal to the electronic switching assembly 20 prompting it to switch all 128 capacitors of the capacitor array 18 on so that they are connected in parallel to the varactor 14. This reduces the oscillating frequency of the voltage-controlled oscillator 12 which results in a change in the output signal of the phase/frequency detector 22 at the output 32. Since switching all 128 capacitors on has resulted in a maximum possible change in frequency of the voltage-controlled oscillator 12, its output frequency is assuredly lower than the desired new output frequency so that comparing the output signal of the phase/frequency detector 22 to the reference voltage $U_{ref}$ in the comparator 38 results in an output signal being produced at the output 42 having the value "1". On the next step in the sequence the control logic 44 will accordingly output a control signal to the electronic switching assembly 20 which prompts it to switch 64 capacitors off so that, now, only half of all available capacitors are connected in parallel to the varactor 14. This results in a corresponding increase in the output frequency $f_{vco}$ of the voltage-controlled oscillator 12. The correspondingly changed output signal of the phase/frequency detector 22 thus results in output of a signal having the value "0" at the output 42 of the comparator 38. On the next step in the sequence the control logic 44 produces a control signal which prompts the electronic switching assembly 20 to switch 32 capacitors of the capacitor array 18 on so that now a total of 96 capacitors are connected in parallel to the varactor 14. Depending on whether the voltage at the output 32 of the phase/frequency detector 22 lies above or below the reference voltage User the comparator 38 again outputs a "0" or "1" signal, prompting the control logic 44 in the next step in the sequence to produce a control signal which prompts off/on of a further 16,8,4,2 capacitors or 1 capacitor.

Once the control logic 44 has attained its last step in the sequence, the eighth step, with which only one single capacitor of the capacitor array 18 is switched on or off, the output frequency $f_{voc}$ produced by the voltage-controlled oscillator 12 corresponds in such an approximation to the desired new frequency value that it is within the fine adjustment range which can be regulated constant in each case solely by the change in capacitance possible by means of the varactor 14. Thus, assuming a division factor S=5 the locked status of the phase-locked loop is attained at the latest after the 40th cycle of the reference frequency $f_{ref}$ at which the output frequency $f_{voc}$ of the voltage-controlled oscillator 12 is within the fine adjustment range. Should again a change in frequency be desired which can no longer be sensed by the closed loop, then the enable signal EN is applied to the enable input 46 so that the sequence as described is again triggered in the control logic 44 which via the electronic switching assembly 20 results in just as many individual capacitors being connected in parallel to the varactor 14 as is needed to produce the desired new output frequency of the voltage-controlled oscillator 12.

It is to be noted that the numerical values indicated in the above example merely serve to illustrate how the circuit works, i.e. any other division factor S may found application and the number of capacitors in the capacitor array 18 may be more or less than the cited number. The phase-locked loop 10 may be fabricated entirely as an integrated circuit and be used in a wealth of applications requiring greatly different output frequencies to be regulated to a control voltage, there thus being no need to adapt the circuit to each particular application.

While the present invention has been described with respect to a specific embodiment, this description is not to be construed in a limiting sense. Various changes and modifications may be apparent to persons skilled in the art upon reference to this description. It is therefore contemplated that the appended claims will cover any such modifications or embodiments as fall within the true scope of the invention.

What is claimed is:

1. A phase-locked loop comprising:

a voltage-controlled oscillator, a control voltage applied to said voltage-controlled oscillator, said control voltage provided by a phase/frequency detector as a function of the difference between the frequency of a reference signal and the output frequency of the voltage controlled oscillator, the oscillator including as a frequency-influencing circuit element a varactor whose capacitance value is variable over a fine adjustment range by the control voltage for altering the output frequency;

a variable capacitance connected in parallel to said varactor responsive to a change in the frequency ($f_{ref}$) of said reference signal, the value of said capacitance being adjustable as a function of said control voltage output by said phase/frequency detector; and a control logic responsive to said control voltage and selected periodic cycles of said frequency of said reference signal to control variation of said variable capacitance.

2. The phase-locked loop as set forth in claim 1, wherein said variable capacitance comprises a plurality of component capacitors selectively connected in parallel to said varactor responsive to said control logic for changing the output frequency ($f_{vco}$) of said voltage-controlled oscillator.

3. A method of automatically setting the output frequency of a phase-locked loop, comprising the step of:

providing a voltage-controlled oscillator having an output at a measurable frequency;

providing and applying a control voltage to said voltage-controlled oscillator provided by a phase/frequency detector as a function of the difference between the frequency of a reference signal and the output frequency of the voltage-controlled oscillator, the voltage-controlled oscillator being provided with, as a frequency-influencing circuit element, a varactor whose capacitance value is variable over a fine adjustment range by the control voltage for altering the output frequency of the voltage-controlled oscillator;

providing a variable capacitance connected in parallel to said varactor responsive to a change in the frequency ($f_{ref}$) of said reference signal, the value of said capacitance being adjustable as a function of said control voltage output; and providing a control logic responsive to said control voltage and selected periodic cycles of said frequency of said reference signal to control variation of said variable capacitance.

4. The method as set forth in claim 3, wherein said variable capacitance comprises a plurality of component capacitors selectively connected in parallel to said varactor responsive to said control logic for changing the output frequency ($f_{vco}$) of said voltage-controlled oscillator.

\* \* \* \* \*